United States Patent [19]

Sakurai et al.

[11] Patent Number: 5,180,989
[45] Date of Patent: Jan. 19, 1993

[54] WIDEBAND AMPLIFIER

[75] Inventors: Hisao Sakurai; Seiichi Nishiyama, both of Kanagawa, Japan

[73] Assignee: Sony Corporation, Tokyo, Japan

[21] Appl. No.: 747,697

[22] Filed: Aug. 20, 1991

[30] Foreign Application Priority Data

Aug. 20, 1990 [JP] Japan .............................. 2-86987[U]

[51] Int. Cl.⁵ .............................................. H03F 3/68
[52] U.S. Cl. ..................................... 330/295; 330/311
[58] Field of Search ................... 330/70, 71, 156, 295, 330/310, 311

[56] References Cited

U.S. PATENT DOCUMENTS 4,926,137 5/1990 Shogaki et al. ................. 330/311 X Primary Examiner—James B. Mullins
Attorney, Agent, or Firm—Hill, Van Santen, Steadman & Simpson

[57] ABSTRACT

A wideband amplifier is provided having a plurality of transistors, the bases of which are commonly grounded, a signal source for generating input signals, an input terminal connected to the signal source, a drive amplifier connected to the input terminal, a plurality of input resistors connected to the drive amplifier and to respective emitters of the transistors, a plurality of load resistors connected to respective collectors of the transistors, and an output terminal connected to a junction where the collector and one of the load resistors are connected with each other.

14 Claims, 3 Drawing Sheets

WIDEBAND AMPLIFIER

BACKGROUND OF THE INVENTION

1. Field of the Invention

This invention relates to a wideband amplifier and particularly to a wideband amplifier of a base-grounded type which is, for instance, utilized in picture control for color display in high resolution CRT systems.

2. Description of the Background Art

FIG. 1 illustrates a conventional wideband amplifier of a base-grounded type. The conventional wideband amplifier includes a single NPN transistor Q, a base of which is grounded through a constant voltage supply 1 (cell). A collector of the transistor Q is connected through a load resistor $R_L$ to a power supply $V_{cc}$. A value of the collector current is substantially equal to that of the emitter current. In this case, a value of the base current is too small to be taken into account. Accordingly, a value of a signal current supplied from a signal source S connected to DC voltage source BA through an input resistor $R_{IN}$ to the emitter of the transistor Q is represented as that of the collector current of the transistor Q. An output amplitude obtained at an output terminal $T_{OUT}$ is determined by values of the load resistor $R_L$ and the signal current supplied to the emitter. In the case when an amplitude of a signal voltage generated at both ends of an input resistor $R_{IN}$ on the basis of an input signal supplied through an input terminal $T_{IN}$ is represented as $V_{IN}$, then an input signal current $I_{IN}$ is transmitted to the transistor Q through the input resistor $R_{IN}$, which is given by the following expression: $I_{IN} = V_{IN}/R_{IN}$. Further, an output signal voltage amplitude $V_{OUT}$ generated at the output terminal $T_{OUT}$ is given by the following expression: $V_{OUT} = I_{IN} \times R_L = V_{IN}/R_{IN} \times R_L$. A gain G of the conventional wideband amplifier is given by $G = V_{OUT}/V_{IN} = R_L/R_{IN}$. Therefore, a larger gain is obtained as a value of the load resistor R becomes larger than that of the input resistor $R_{IN}$.

In the conventional wideband amplifier as mentioned above, the gain G is defined as:

$$G = R_L/R_{In} \quad (1)$$

where a value of resistance in the emitter of the transistor Q is not taken into account.

A cut-off frequency fc at which the gain is -3dB is defined as the following expression:

$$fc = \frac{1}{\{2\pi \cdot (C_{CS} + C_U) \cdot (R_L // r_o)\}} \quad (2)$$

where the input resistor, the load resistor, and an output impedance of the transistor Q are respectively represented as $R_{IN}$, $R_L$, and $r_o$. Parasitic capacitance, namely base-emitter capacitance, base-collector capacitance, and collector-substrate capacitance, are respectively represented as $C_\pi$, $C_U$, and $C_{CS}$.

FIG. 2 shows a schematic sectional configuration of the NPN transistor. As illustrated in FIG. 2, the collectorsubstrate capacitance $C_{CS}$ is generated at P-N junctions on which a P layer of a substrate SUB is connected to an N layer of the collector C, and having an N+ layer embedded therein, respectively. In addition, the base-collector capacitance $C_U$ is generated on a P-N junction on which a P layer of a base B is connected to the N layer of the collector C. The collector-substrate capacitance $C_{CS}$ is larger than the base-collector capacitance $C_U$. Namely, it is expressed as $C_U << C_{CS}$.

Further, since a value $r_o$ of the output impedance is usually high and larger than the value $R_L$, namely $R_L << r_o$, the expression (2) is represented as the following approximation.

$$Fc \approx \frac{1}{2\pi \cdot C_{cs} \cdot R_L} \quad (3)$$

As is understood from the aforementioned expressions (1) and (2), lector-substrate capacitance $C_{CS}$ or the values of the input resistor $R_{IN}$ and the load resistor $R_L$ should be reduced in order to improve the frequency characteristic fc of the conventional wideband amplifier without any change in the gain G.

However, in view of the structure of the NPN transistor, a P-N junction and collector-substrate capacitance $C_{CS}$ are inevitably produced, as shown in FIG. 2. A value of the capacitance $C_{CS}$ generated at the P-N junction is the result of a manufacturing technique utilized for semiconductor devices. At the present time, a satisfactory technique by which the capacitance is reduced to a negligible level has not been developed.

Moreover, when the frequency characteristic fc is increased without any change in the gain G by reducing the input resistance $R_{IN}$ and the load resistance $R_L$, a dynamic range for an input signal $S_1$ becomes narrower due to the reduction in the input resistance $R_{IN}$ of the input resistor. This is because the dynamic range is determined depending upon the input resistor $R_{IN}$ and a constant current Io flowing between the collector C and the emitter E. A relationship among an input current $\Delta_i$ generated by the input signal $S_1$, an amplitude $v_{in}$ of the input signal, and the input resistor $R_{IN}$ is represented by the following expression:

$$v_{in} = R_{IN} \cdot \Delta i$$

Further, a relationship between the input resistor $R_{IN}$, the current Io, and an input dynamic range $V_{IN}$ is represented by the following expression:

$$Io \cdot R_{IN} > V_{IN} \quad (4)$$

where Io > ON (conducting state).

As is understood from the expression (4), the input dynamic range $V_{IN}$ is proportionate to the input resistor $R_{IN}$ and the current Io. Accordingly, as the input resistor $R_{IN}$ decreases, the input dynamic range $V_{IN}$ becomes narrower. Therefore, an output dynamic range becomes narrower on the basis of the aforementioned expression (1).

In order to recover the dynamic range which is narrowed due to reduction in the input resistance $R_{IN}$ and the load resistance $R_L$, the current Io should be increased.

FIG. 3 shows a relationship between a collector current for one NPN transistor for a semiconductor device such as an IC, and a transition frequency $f_T$ at which a current amplification degree $h_{FE}$ indicating a ratio of the collector current to an emitter current in an emitter-grounded transistor is 1. As shown in FIG. 3, as the collector current exceeds a value $Io'$ where the transition frequency reaches a value $f_{TMAX}$, the transition frequency $f_T$ begins an abrupt decrease. In addition to the collectorsubstrate capacitance $C_{CS}$, a maximum allowable current (io) is also determined by the manufacturing limitations.

In addition, it is desirable to reduce a total amount of a consumed current for the IC package by reducing an amount of current flowing in each of the transistors contained in an IC package, in order to conserve electric power. If the amount of current in each transistor is not reduced, the total amount of the consumed electric power for the IC package increases and causes an increase in the temperature of the IC chip. In the worst case, the temperature increases to a level which is unacceptable for IC packages.

As a result, conventional wideband amplifiers are limited in the degree of frequency characteristic fc improvement attainable, without a change in either the gain G and/or the dynamic range.

Referring to FIG. 4, a cascade inversion amplifier of an emitter-grounded type is shown as a typical example of a conventional wideband amplifier. In this amplifier, the frequency characteristic is deteriorated at the input stage where the transistor receives an input signal, due to parasitic capacitance and an input impedance which both have an undesirable influence thereon. Further, the cascade amplifier has an essential problem in that the output dynamic range becomes small due to its structure.

SUMMARY OF THE INVENTION

It is an object of the present invention to eliminate the aforementioned disadvantages and to provide a wideband amplifier characterized in that a frequency characteristic is effectively improved without changes in respective values of an input/output gain and dynamic range as utilized for a conventional wideband amplifier.

In order to accomplish this object, there is provided a wideband amplifier including a plurality of transistors, the bases of which are commonly grounded, a signal source for generating input signals, an input terminal connected to the signal source, and a drive amplifier connected to the input terminal. The wideband amplifier also includes a plurality of input resistors and a plurality of load resistors. The input resistors are connected to the drive amplifier and to respective emitters of the transistors which receive the input signals from the signal source. The load resistors are connected to the collectors of the respective transistors. The wideband amplifier further includes an output terminal connected to a junction where the collector and one of the load resistors are contacted with each other.

DESCRIPTION OF THE PREFERRED EMBODIMENT

The preferred embodiment of a wideband amplifier according to the present invention will now be described with reference to the accompanying drawings.

Figure 5:
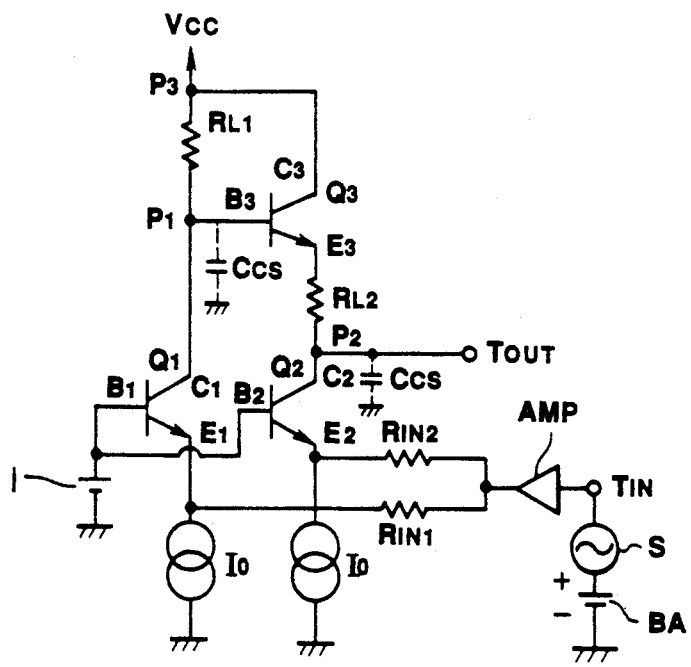
FIG. 5 is a circuit diagram of one embodiment of a wideband amplifier according to the present invention.

Referring to FIG. 5, a wideband amplifier of the invention includes a plurality of NPN transistors each having the same rating, which are grounded at respective bases thereof and arranged in a multistage configuration. Bases $B_1$, $B_2$ of NPN transistors $Q_1$, $Q_2$ are respectively grounded through a battery 1. Emitters $E_1$, $E_2$ of the transistors $Q_1$, $Q_2$ are connected to input resistors $R_{IN1}$, $R_{IN2}$, respectively. The resistors $R_{IN1}$, $R_{IN2}$ are connected through a drive amplifier AMP to an input terminal $T_{IN}$ connecting to a signal source S and DC source BA. A collector $C_1$ of the transistor $Q_1$ is connected through a load resistor $R_{L1}$ to a power supply $V_{CC}$. A collector $C_2$ of the transistor $Q_2$ is connected through a load resistor $R_{L2}$ to an emitter $E_3$ of an NPN transistor $Q_3$. An output terminal $T_{OUT}$ is connected to a junction $P_2$ at which the collector $C_2$ of the transistor $Q_2$ is connected to the load resistor $R_{L2}$. A base $B_3$ of the transistor $Q_3$ is connected to a junction $P_1$ at which the transistor $Q_1$ is connected to the load resistor $R_{L1}$. A collector $C_3$ of the transistor $Q_3$ is connected to a junction $P_3$ at which the load resistor $R_1$ is connected to the power supply $V_{CC}$.

Functions of the preferred embodiment of the wideband amplifier according to the invention will be described hereinbelow.

Figure 1:
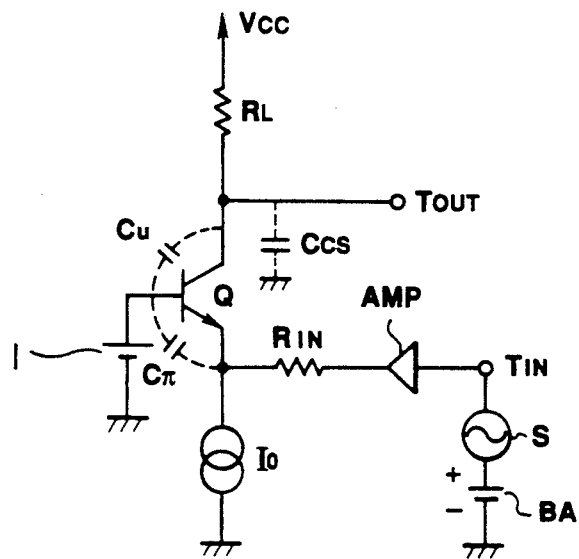
FIG. 1 is a circuit diagram of a conventional wideband amplifier.
Figure 2:
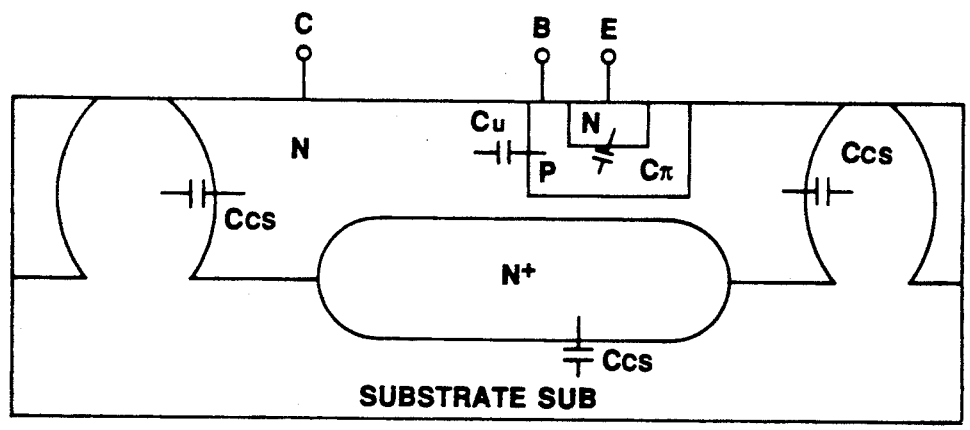
FIG. 2 is a schematic configuration of a prior art NPN transistor.
Figure 3:
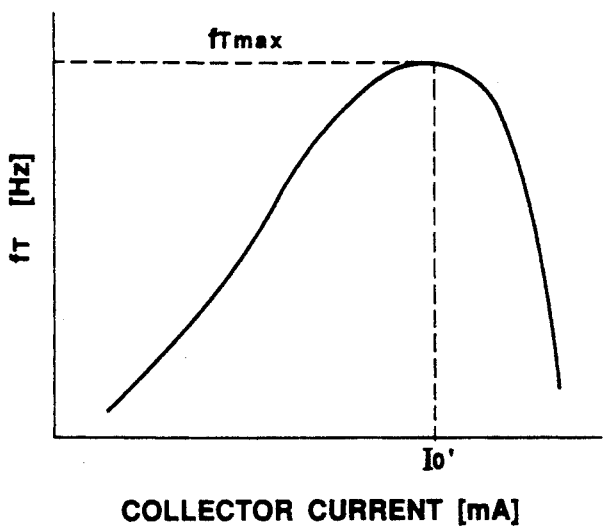
FIG. 3 is a graph showing a relationship between a collector current and a transition frequency in the prior art NPN transistor.
Figure 4:
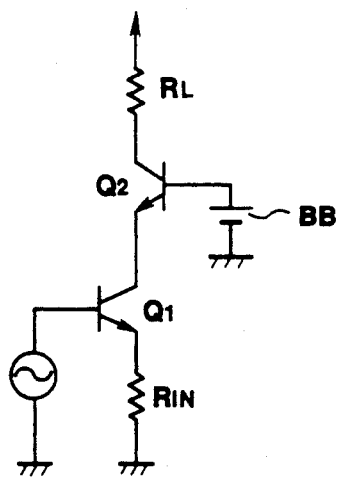
FIG. 4 is a circuit diagram of a prior art cascade inversion amplifier.

As shown in FIG. 5, the transistors $Q_1$ and $Q_2$ are arranged in the same phase as an input signal $S_1$ transferred from a signal source S through the input terminal $T_{IN}$. A resistance of each of the load resistors $R_{L1}$ and $R_{L2}$ is ½ the resistance value of load resistor $R_L$ of a conventional wideband amplifier as shown in FIG. 1. The resistances of respective input resistors $R_{IN1}$ and $R_{IN2}$ are equal in value to input resistor $R_{IN}$ of the conventional wideband amplifier shown in FIG. 1. Respective maximum allowable currents Io for the transistors $Q_1$ and $Q_2$ are equal to a maximum allowable current Io for the transistor Q as in the conventional wideband amplifier shown in FIG. 1.

A gain $G_1$ at the junction $P_1$ is defined as $(R_L/2)/R_{IN}$.

Since collector voltages of the transistors $Q_1$ and $Q_2$ have the same phase, a gain $G_2$ at the junction $P_2$ is $G_1+(R_L/2)/R_{IN}$. Namely, it is expressed as $((R_L/2)/R_{IN})+((R_L/2)/R_{IN})=R_L/R_{IN}$.

Accordingly, in case the respective maximum allowable currents Io for the transistors $Q_1$ and $Q_2$ and the gain at the output terminal $T_{OUT}$ are equal to those conventionally used, the respective load resistances of resistors $R_{L1}$ and $R_{L2}$ are ½ the value of the conventional load resistor $R_L$. As a result, the cut-off frequency fc at which the gain is $-3dB$ is twice that of the conventional wideband amplifier.

A frequency characteristic of the wideband amplifier according to the invention which employs the two transistors $Q_1$ and $Q_2$ is obtained in the following manner.

At first, a transfer function $G(S_1)$ of the conventional wideband amplifier as shown in FIG. 1 is given by the following expression:

$$G(S_1) = \frac{R_L/R_{IN}}{1 + j\frac{f}{fc}} \quad (5)$$

where fc represents the cut-off frequency of a conventional wideband amplifier as shown in FIG. 1.

Based on the above expression (5), a transfer function $G(S_2)$ of the aforementioned wideband amplifier according to the invention is defined by the following expression:

$$G(S_2) = \left(\frac{1}{1+j\frac{f}{fc}} \cdot \frac{1}{1+j\frac{f}{fc}}\right) \cdot \frac{R_{L1}}{R_{IN}} + \left(\frac{1}{1+j\frac{f}{fc}}\right) \cdot \frac{R_{L2}}{R_{IN}} \quad (6)$$

where, as mentioned above, the cut-off frequency of the wideband amplifier according to the invention is two times that of the conventional one, and $R_L/R_{IN}$ is constant. Accordingly, a cut-off frequency fc' of the wideband amplifier according to the invention is obtained by substituting f=fc' and $G(S)_2 = 1\sqrt{2}$ in the above expression (6).

$$\frac{\left|1 + j\frac{1}{4} \cdot \frac{fc'}{fc}\right|}{\left|1 + j\frac{fc'}{2fc} \cdot 1 + j\frac{fc'}{2fc}\right|} = \quad (7)$$

$$\frac{\left|1 + j\frac{1}{4} \cdot \frac{fc'}{fc}\right|}{\left|\left(1 - \frac{fc'^2}{4fc^2}\right) + j\frac{fc'}{fc}\right|} = \frac{1}{\sqrt{2}}$$

The cut-off frequency fc' is calculated from the above expression (7).

$$fc' = \sqrt{2}\, fc$$

Namely, the gain G(S)z is approximately $\sqrt{2}$ times the gain $G(S_1)$. the cut-off frequency fc' of the wideband amplifier according to the invention may be approximately 1.29 times the cut-off frequency fc of a conventional wideband amplifier.

Figure 6:
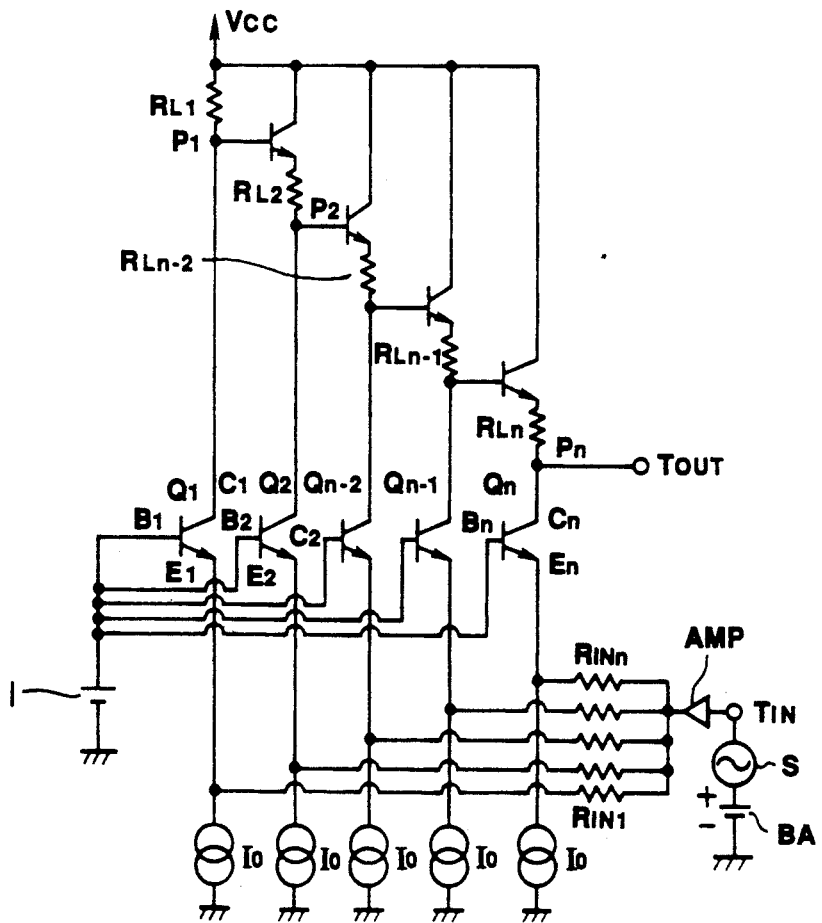
FIG. 6 is a circuit diagram of another embodiment of the wideband amplifier according to the invention.

The present invention is not limited only to the aforementioned preferred embodiment, but is further applicable in a second embodiment as shown in FIG. 6.

Referring to FIG. 6, transistors $Q_1, Q_2, ... Q_n$ with the same rating are arranged in n stages and have the bases commonly grounded. Values of load resistors $R_{L1}$, $R_{L2}...R_{Ln}$ which are respectively connected to collectors $C_1, C_2, C_n$ of the transistors $Q_1, Q_2, ... Q_n$ may be 1/n times that of a conventional wideband amplifier.

In the embodiment shown in FIG. 6, a gain $G(S_3)$ is obtained at the transfer frequency by the following expression.

$$G(S_3) = \frac{\frac{R_{L1}}{R_{IN1}}}{\left(1+j\frac{f}{nfc}\right)^n} + \frac{\frac{R_{12}}{R_{In2}}}{\left(1+j\frac{f}{nfc}\right)^{n-1}} + \quad (8)$$

$$\ldots + \frac{\frac{R_{Ln-1}}{R_{INn-1}}}{\left(1+j\frac{f}{nfc}\right)^2} - \frac{\frac{R_{Ln}}{R_{INn}}}{\left(1+j\frac{f}{nfc}\right)}$$

Further, in case that Fc" represents a cut-off frequency at which the gain is $-3dB$, $f = fc''$ and $|G(S_3)| = 1/\sqrt{2}$ are substituted in the above expression (8).

$$\frac{R_L}{nR_{IN}}\left(\frac{1}{\left|1+j\frac{fc''}{nfc}\right|^n} + \frac{1}{\left|1+j\frac{fc''}{nfc}\right|^{n-1}} + \ldots + \right.$$

$$\left. \frac{1}{\left|1+j\frac{fc''}{nfc}\right|^2} + \frac{1}{\left|1+j\frac{fc''}{nfc}\right|}\right) = \frac{1}{\sqrt{2}} \cdot \frac{R_L}{R_{IN}} \quad (9)$$

where $$\begin{cases} R_{L1} = R_{L2} = \ldots = R_{Ln} = R_{u/n} \\ R_{IN1} = R_{IN2} = \ldots = R_{iNn} = R_{IN} \ldots \end{cases}$$

On the basis of the above expression (9), the cut-off frequency fc" is represented as the following expression.

$$fc'' = (2^{1/n} - 1)^{1/2} nfc \quad (10)$$

Accordingly, as a value n in the above expression (10) becomes large, the cut-off frequency fc" increases. However, in the embodiment as shown in FIG. 6, a dynamic range for a direct current is reduced and a large output amplitude is not obtained, while the frequency characteristic is improved.

As is obvious from the aforementioned description of the preferred embodiment according to the invention, respective resistances of load resistors connected to the collectors of a plurality of transistors of a base-grounded type are 1/n of the values utilized in conventional wideband amplifiers. Therefore, the frequency characteristic of a wideband amplifier according to the invention can be improved without any change in the gain or the dynamic range.

Although various minor changes and modifications might be proposed by those skilled in the art, it will be understood that we wish to include within the claims of the patent warranted hereon all such changes and modifications as reasonably come within our contribution to the art.

We claim as our invention:

1. 1. A wideband amplifier, comprising:
    a plurality of transistors, bases of which are commonly grounded;
    a signal source means for generating input signals;
    an input terminal connected to said signal source means;
    a drive amplifier having an input connected to said input terminal;
    a plurality of input resistors connecting an output of said drive amplifier to respective emitters of said plurality of transistors such that said emitters can receive input signals from said signal source;
    a plurality of load resistors connected to respective collectors of said plurality of transistors; and an output terminal connected to a junction where the collector of one of said transistors and one of said plurality of load resistors are connected with each other.

2. An amplifier according to claim 1 wherein a junction between the load resistor and the respective collector of at least one other transistor is connected to control an additional transistor connected to the load resistor which is connected to the output terminal, and wherein the additional transistor and the load resistor of the at least one other transistor are connected to a supply voltage.

3. An amplifier according to claim I wherein the load resistors connect collectors of the transistors to a voltage supply.

4. An amplifier according to claim 1 wherein the bases of the transistors connect to ground through a voltage source.

5. An amplifier according to claim I wherein the signal source means connects to ground through a voltage source.

6. A wideband amplifier, comprising:
- at least first and second transistors, bases of which are commonly connected to a first voltage supply;
- a signal source means for generating input signals;
- a drive amplifier connecting the signal source means to first and second input resistors connected to respective emitters of said first and second transistors;
- first and second load resistors connected to respective collectors of said first and second transistors;
- an output terminal connected to a junction where the collector of the second transistor and its respective second load resistor are connected with each other; and
- the collectors of the first and second transistors being connected through the first and second resistors to a second voltage supply.

7. An amplifier according to claim 6 wherein the second load resistor connects to said second voltage supply through an additional transistor.

8. An amplifier according to claim 7 wherein a base of the additional transistor is connected to a junction between the first load resistor and first transistor collector, an emitter of the additional transistor connects to the output terminal through the second load resistor, and the collector connects to said second voltage supply.

9. An amplifier according to claim 6 wherein emitters of the first and second transistors connect to ground reference via first and second current sources.

10. An amplifier according to claim 6 wherein bases of the first and second transistors are commonly connected to ground reference through said first voltage supply.

11. An amplifier according to claim 6 wherein said signal source means connects to ground reference through a third voltage supply.

12. An amplifier according to claim 6 wherein a third transistor is provided whose base is commonly connected to the first voltage supply, whose emitter is connected through a respective input resistor and the drive amplifier to the signal source means, and whose, collector is connected through a third load resistor to the second voltage supply.

13. An amplifier according to claim 12 wherein the second load resistor connects to said second voltage supply through a first additional transistor and the third load resistor connects to said second voltage supply through a second additional transistor.

14. An amplifier according to claim 13 wherein a control input of the first additional transistor connects between the first transistor collector and the first load resistor, and wherein a control input of the second additional transistor connects between the second load resistor and the collector of the second transistor.

* * * * *